United States Patent
Nagatoshi et al.

(10) Patent No.: US 6,972,393 B2
(45) Date of Patent: Dec. 6, 2005

(54) MACHINING DEVICE AND MACHINING METHOD

(75) Inventors: Hideaki Nagatoshi, Osaka (JP); Kazutomo Kotera, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 206 days.

(21) Appl. No.: 10/297,526

(22) PCT Filed: Jun. 5, 2002

(86) PCT No.: PCT/JP02/05533

§ 371 (c)(1),
(2), (4) Date: May 21, 2003

(87) PCT Pub. No.: WO02/098596

PCT Pub. Date: Dec. 12, 2002

(65) Prior Publication Data

US 2003/0178398 A1    Sep. 25, 2003

(30) Foreign Application Priority Data

Jun. 5, 2001    (JP)    ............................. 2001-169212

(51) Int. Cl.[7] ....................... B23K 26/02; B23K 26/04; B23K 26/36
(52) U.S. Cl. ........................ 219/121.76; 219/121.81; 219/121.82
(58) Field of Search ................ 219/121.67, 121.68, 219/121.69, 121.7, 121.71, 121.72, 121.78, 219/121.81, 121.82, 121.83, 121.76, 121.77

(56) References Cited

U.S. PATENT DOCUMENTS

| | | | | |
|---|---|---|---|---|
| 4,504,727 A | * | 3/1985 | Melcher et al. | 219/121.62 |
| 5,227,607 A | * | 7/1993 | Ishiyama | 219/121.68 |
| 5,718,036 A | * | 2/1998 | Oji et al. | 29/603.12 |
| 5,718,832 A | * | 2/1998 | Mori | 219/121.83 |
| 5,792,411 A | * | 8/1998 | Morris et al. | 264/400 |
| 6,049,057 A | * | 4/2000 | Imai et al. | 219/121.7 |
| 6,060,684 A | * | 5/2000 | Moriike | 219/121.75 |
| 6,087,625 A | * | 7/2000 | Iso | 219/121.8 |
| 6,380,512 B1 | * | 4/2002 | Emer | 219/121.71 |
| 6,538,231 B2 | * | 3/2003 | Karube et al. | 219/121.76 |

FOREIGN PATENT DOCUMENTS

| | | | |
|---|---|---|---|
| EP | 0884128 | | 12/1998 |
| JP | 48-678 | | 1/1973 |
| JP | 10-006049 | | 1/1998 |
| WO | WO9611769 | * | 4/1996 |

* cited by examiner

*Primary Examiner*—Samuel M. Heinrich
(74) *Attorney, Agent, or Firm*—RatnerPrestia

(57) ABSTRACT

A machining device for simultaneously machining a plurality of work pieces 71, 72 on one machining table 7 with high positional accuracy is provided. The machining device detects positions of the work pieces 71, 72 with detectors 91, 92 mounted to respective machining heads 81, 82. The machining device has respective units for, based on the positional data, moving the machining table 7 to a position where displacements of respective machining heads 81, 82 are nearly equal, and for moving machining ranges of machining heads 81, 82 so as to substantially eliminate displacements between respective machining heads 81, 82 and work pieces 71, 72.

14 Claims, 13 Drawing Sheets

MACHINING DEVICE AND MACHINING METHOD

This application is a U.S. national phase application of PCT international application PCT/JP02/05533.

FIELD OF THE INVENTION

The present invention relates to a machining device comprising a machining table for receiving a work piece, a machining head, and a position detector for detecting a position of the work piece, and to a machining method.

BACKGROUND OF THE INVENTION

A conventional machining device that uses a laser beam as a machining means and comprises a machining table for receiving a work piece, a machining head, and a position detector for detecting a position of the work piece has a structure as shown in FIG. 11. The conventional machining device will be described hereinafter with reference to FIG. 11.

Main controller 2 divides drill data in storage unit 1 into positional data and machining condition data, and stores respective data in storage units 31, 32. Printed board 71, namely the work piece, is placed on machining table 7. Y-axis driving unit 61 and X-axis driving unit 62 drive machining table 7 two-dimensionally. Laser beams emitted from laser oscillator 51 are guided to machining head 81 by mirrors 52a, 52b. Machining head 81 is fixed to a position facing machining table 7. Machining head controller 8 controls machining head 81 to two-dimensionally position the incident laser beams and to radiate the laser beams to printed board 71. Machining head 81 is provided with camera 91 that is used for seeing a mark for alignment. The mark has been put on the printed board. Recognizing unit 9 recognizes a position of the mark for alignment from an image obtained by camera 91, and then detects the position of printed board 71. Positional information of printed board 71 detected by recognizing unit 9 is fed to main controller 2, and main controller 2 outputs a moving command to machining table controller 6. The moving command aims to substantially eliminate displacement between the position of printed board 71 and that of machining head 81. Machining table controller 6 receives the moving command from main controller 2, reads positional data, and controls Y-axis driving unit 61 and X-axis driving unit 62 to move the machining table to a position where the displacement between the position of printed board 71 and that of machining head 81 is substantially eliminated. Main controller 2 receives a signal indicating the completion of the movement from machining table controller 6, outputs a command for starting the control of machining head 81 to machining head controller 8, and outputs a command for laser control to laser controller 5. Laser controller 5, on receiving the signal for laser control from main controller 2, reads machining condition data, and controls laser oscillator 51 to radiate laser beams.

A machining device having the structure discussed above carries in one printed board, machines it, and carries out it after the machining. The machining device then carries in next one printed board, and repeats this process.

Recently, requests for downsizing and lightening electronic equipment have become strong, and demands for packaging or high density mounting increase. Improvement of the productivity is required in response to this situation, but tact time from the start to the completion of the machining is limited and a plurality of machining devices are required for improving the productivity. This case requires a place for installing the plurality of machining devices, and thus the productivity per area is disadvantageously reduced. Therefore, a machining device that has at least two machining heads and one machining table and can simultaneously machine at least two printed boards is required to improve the productivity with increase of the installation area suppressed.

When a plurality of machining heads are mounted to the conventional machining device, however, errors occur in the mounting positions and errors occur in positions on one machining table for receiving at least two printed boards. In simultaneously machining at least two printed boards, therefore, a resultant error of two kinds of errors works as an error in a machining position to reduce the machining accuracy.

DISCLOSURE OF THE INVENTION

A machining device comprises a machining table for receiving at least two work pieces, at least two machining heads that are substantially fixed at positions facing the machining table and machine the work pieces, and a detector for detecting a position of each work piece. This machining device nearly equalizes displacements of respective machining heads with the machine heads, and substantially eliminates the displacement of each machining head by moving machining ranges of the machining heads.

DETAILED DESCRIPTION OF THE PREFERRED EMBODIMENT

Machining devices in accordance with exemplary embodiments of the present invention will be described hereinafter with reference to the accompanying drawings. In the following description, similar elements are denoted with the same reference numbers, and the detailed descriptions of those elements are omitted.

(Exemplary Embodiment 1)

Figure 1:
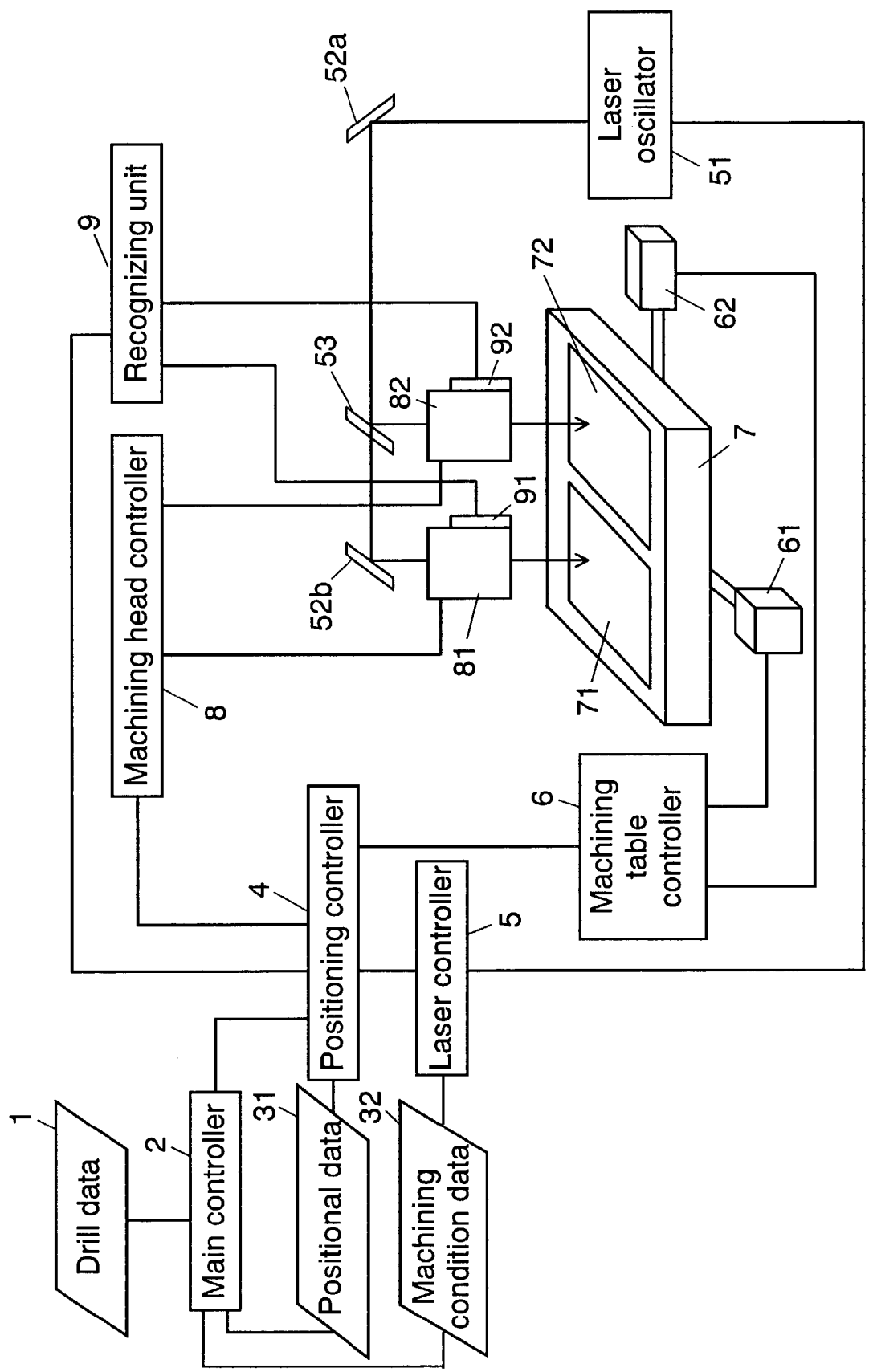
FIG. 1 is a block diagram of a machining device in accordance with exemplary embodiment 1 of the present invention.

FIG. 1 is a block diagram of a machining device in accordance with exemplary embodiment 1 of the present invention.

Figure 12:
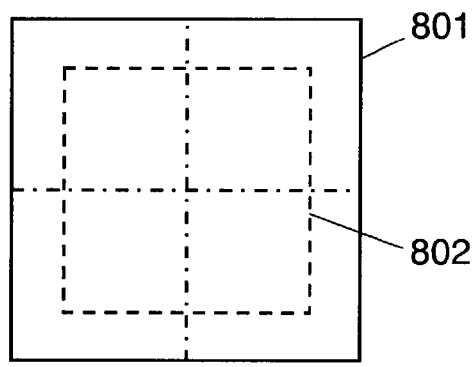
FIG. 12 is a pattern diagram of machining ranges of the machining heads.

Main controller 2 divides drill data having machining positions and machining conditions in storage unit 1 into positional data and machining condition data, and stores respective data in storage units 31, 32. Printed boards 71, 72, namely work pieces, are placed on machining table 7. Y-axis driving unit 61 and X-axis driving unit 62 drive machining table 7 two-dimensionally. Laser beams emitted from laser oscillator 51 are guided to machining head 81 by mirrors 52a, 52b. Machining head 81 is fixed to a position facing machining table 7. Spectroscope 53 is disposed between mirrors 52a and 52b, branches the laser beams, and guides the branched laser beams to the other machining head 82. Machining head controller 8 controls machining heads 81, 82 to two-dimensionally position the incident laser beams and to radiate the laser beams to printed boards 71, 72. Machining heads 81, 82 have ranges allowing two-dimensional positioning. The ranges are maximum machining range 801 indicating a limit as shown in FIG. 12 and machining range 802 used for usual machining. Machining range 802 is controlled by machining head controller 8 and can be moved within maximum machining range 801. Each of machining heads 81, 82 has each of cameras 91, 92 for observing a mark for alignment put on each printed board. Recognizing unit 9 recognizes positions of the marks for alignment from images observed by cameras 91, 92, and then detects respective positions of printed boards 71, 72.

Figure 6:
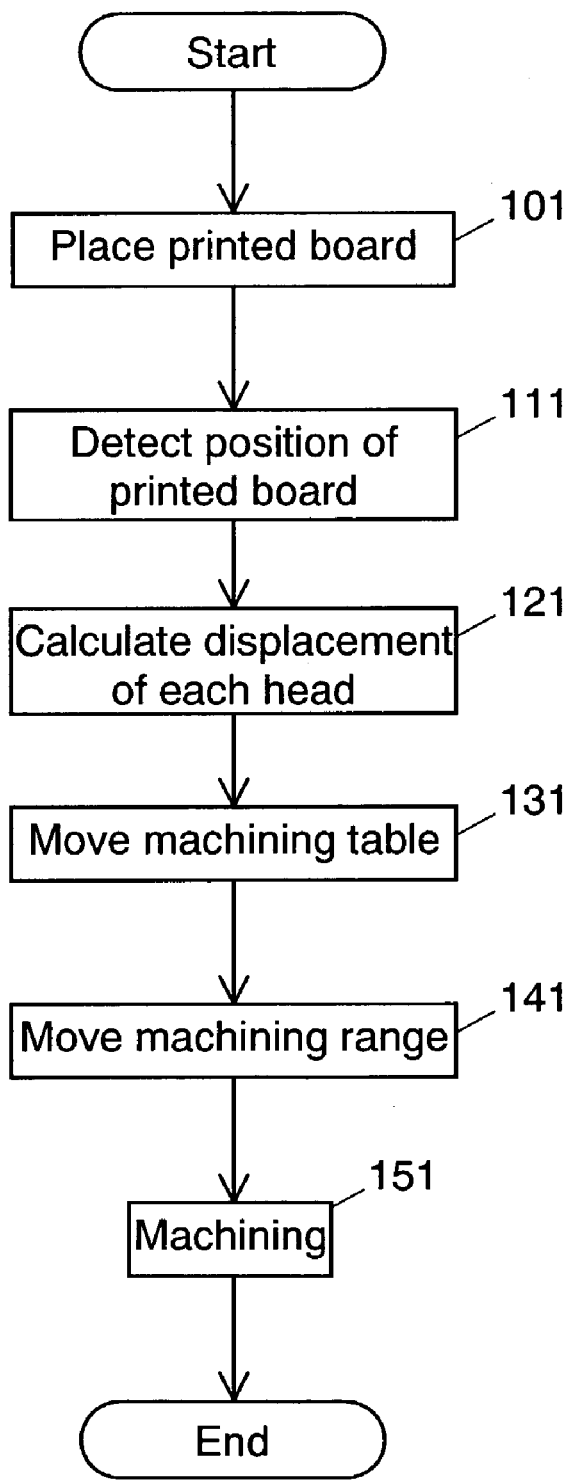
FIG. 6 is a flow chart of a machining method in accordance with exemplary embodiment 1 of the present invention.

Operations of the machining device of the present embodiment are described hereinafter step by step with reference to FIG. 1, FIG. 6, and FIG. 12.

Placing step 101 of the printed boards: On starting the machining, two printed boards 71, 72 of printed boards (work pieces) are placed on machining table 7.

Detecting step 111 of positions of the printed boards: Recognizing unit 9 detects positions of printed boards 71, 72. Then, on receiving an operation command from main controller 2, positioning controller 4 receives positional information of printed boards 71, 72.

Calculating step 121 of displacement every head: Displacements between respective machining heads 81, 82 and respective printed boards are calculated. Positioning controller 4 outputs, to machining table controller 6, a moving command for nearly equalizing the displacement between the position of printed board 71 and the position of machining head 81 with the displacement between the position of printed board 72 and the position of machining head 82.

Moving step 131 of the machining table: Machining table controller 6 controls Y-axis driving unit 61 and X-axis driving unit 62 to move machining table 7 to a position where calculated displacements are nearly equal.

Moving step 141 of the machining range: Positioning controller 4 outputs, to machining head controller 8, a moving command for substantially eliminating the displacement of each machining head that remains after the movement of machining table 7, and moves machining range 802 with each machining head.

The series of operations correct the displacement between each machining head and each printed board. Then, machining step 151 is performed by laser radiation.

Positioning controller 4 moves the machining table so as to nearly equalize the displacements between respective machining heads and work pieces, and moves machining ranges of respective machining heads so as to substantially eliminate the remaining displacements. Thus, when a plurality of work pieces are placed on one machining table and simultaneously machined by a plurality of machining heads, displacement between each machining head and each work piece can be eliminated.

(Exemplary Embodiment 2)

Figure 2:
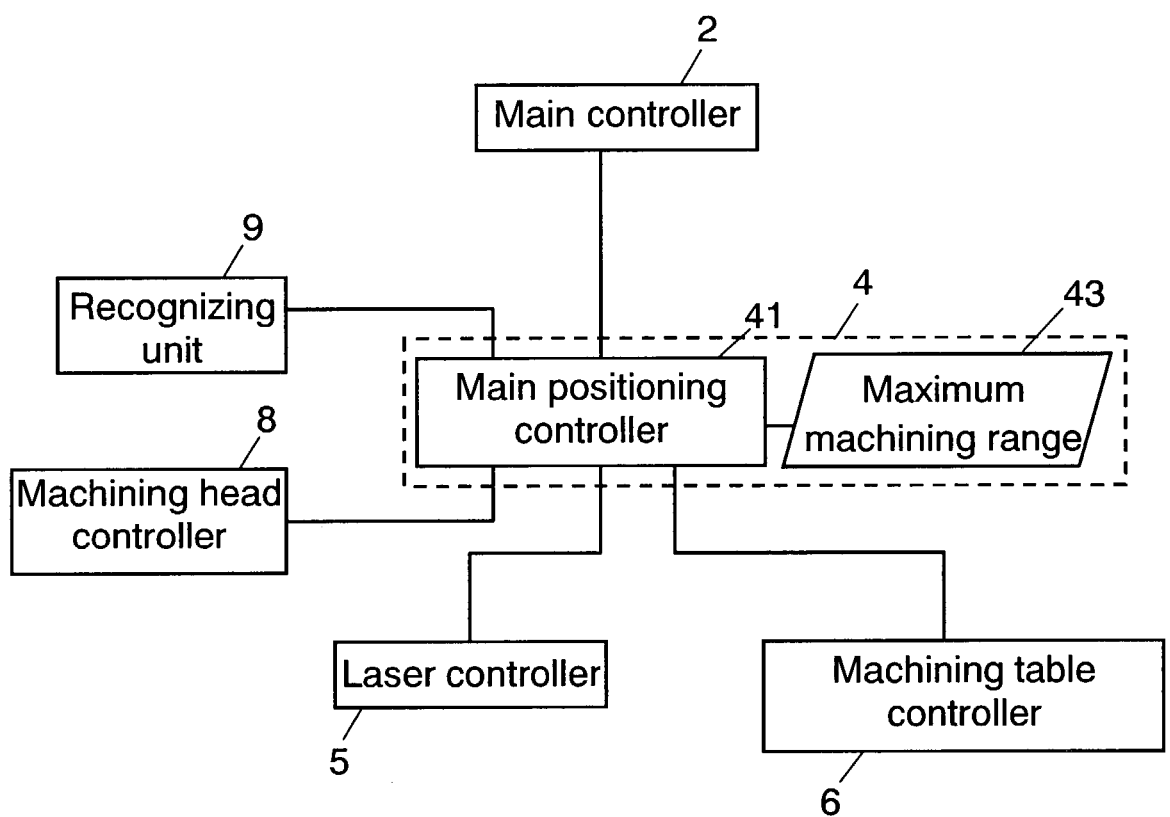
FIG. 2 is a block diagram of a positioning controller of a machining device in accordance with exemplary embodiment 2 of the present invention.
Figure 7:
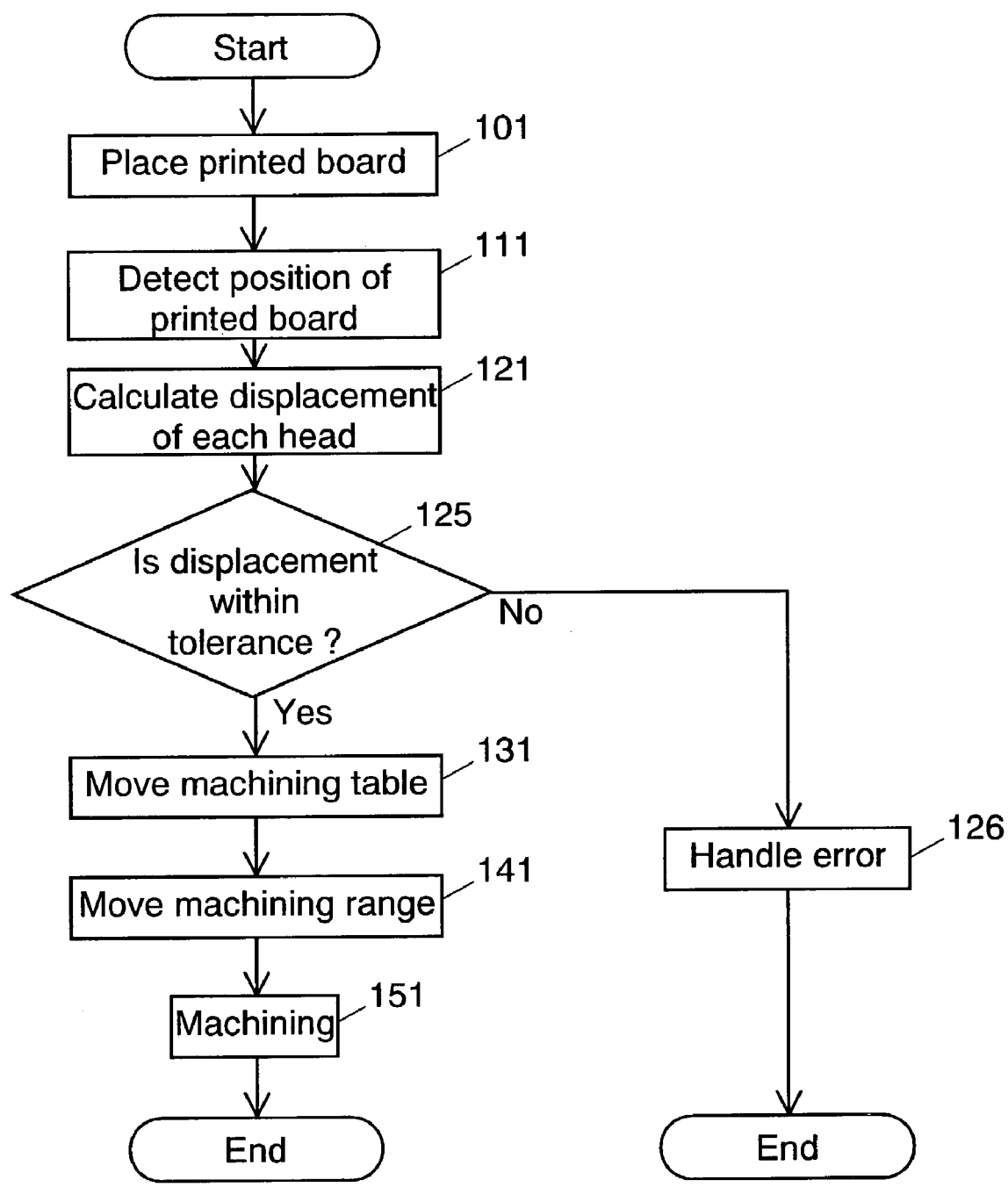
FIG. 7 is a flow chart of a machining method in accordance with exemplary embodiment 2 of the present invention.

FIG. 2 is a detailed block diagram of positioning controller 4 of a machining device in accordance with exemplary embodiment 2 of the present invention. Positioning controller 4 has main positioning controller 41 and storage unit 43 for storing a maximum machining range of each machining head. The other elements are the same as those of exemplary embodiment 1. FIG. 7 illustrates a machining method having the following steps between calculating step 121 of displacement every head and moving step 131 of the machining table in FIG. 6.

Step 125: It is checked whether or not moving amounts of machining ranges of the machining heads exceed the maximum machining ranges. When the moving amounts are within the maximum machining ranges, the operation proceeds to moving step 131.

Error handling step 126: When the moving amounts are out of the maximum machining ranges, error handling such as the stop of the machining is performed and the machining is finished.

Operations of the present embodiment are described with reference to FIG. 2 and FIG. 7.

Main positioning controller 41, in moving the machining range of each machining head so as to substantially eliminate the displacement between each machining head and each work piece, determines in step 125 whether or not the movement of the machining range exceeds the maximum machining range stored in storage unit 43. When the machining range exceeds the maximum machining range, the operation proceeds to step 126, and main positioning controller 41 outputs a signal for stopping the machining to main controller 2, recognizing unit 9, machining head controller 8, laser controller 5, and machining table controller 6.

Thus, each machining head is prevented from moving in a machining range exceeding the maximum machining range.

(Exemplary Embodiment 3)

Figure 3:
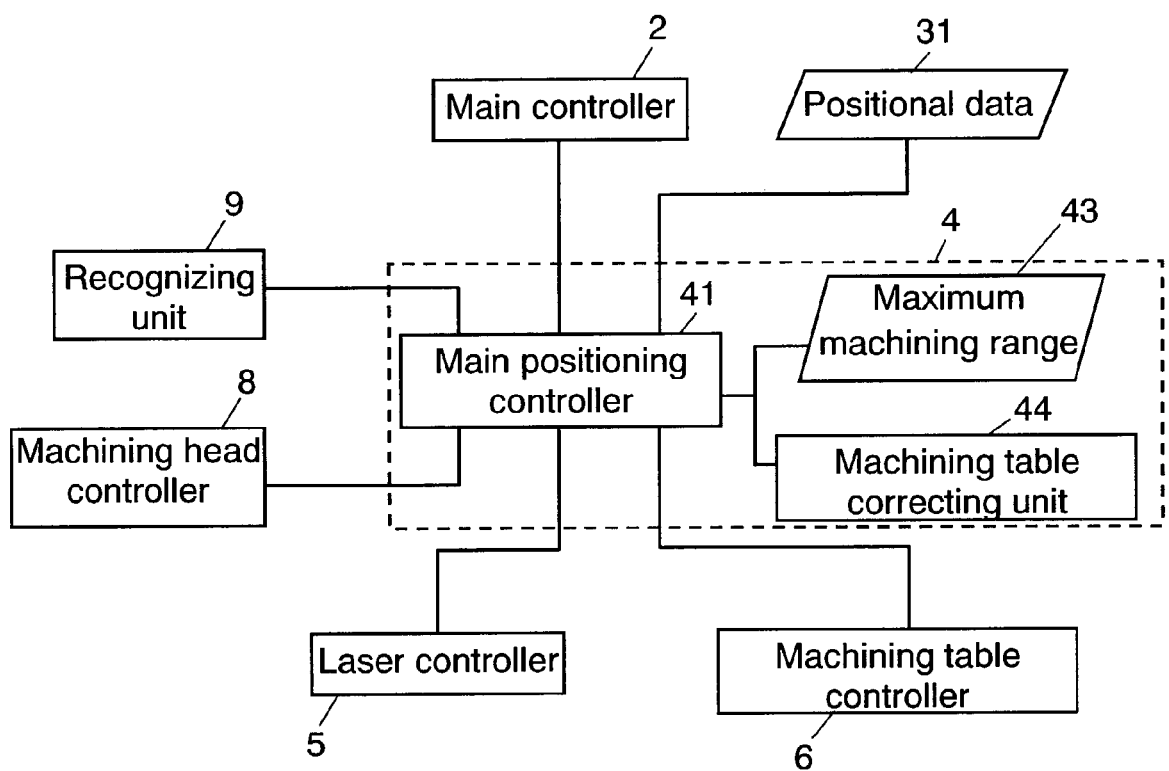
FIG. 3 is a block diagram of a positioning controller of a machining device in accordance with exemplary embodiment 3 of the present invention.

FIG. 3 is a detailed block diagram of a positioning controller of a machining device in accordance with exemplary embodiment 3 of the present invention. Positioning controller 4 has machining table correcting unit 44 in addition to the elements in exemplary embodiment 2.

Figure 8:
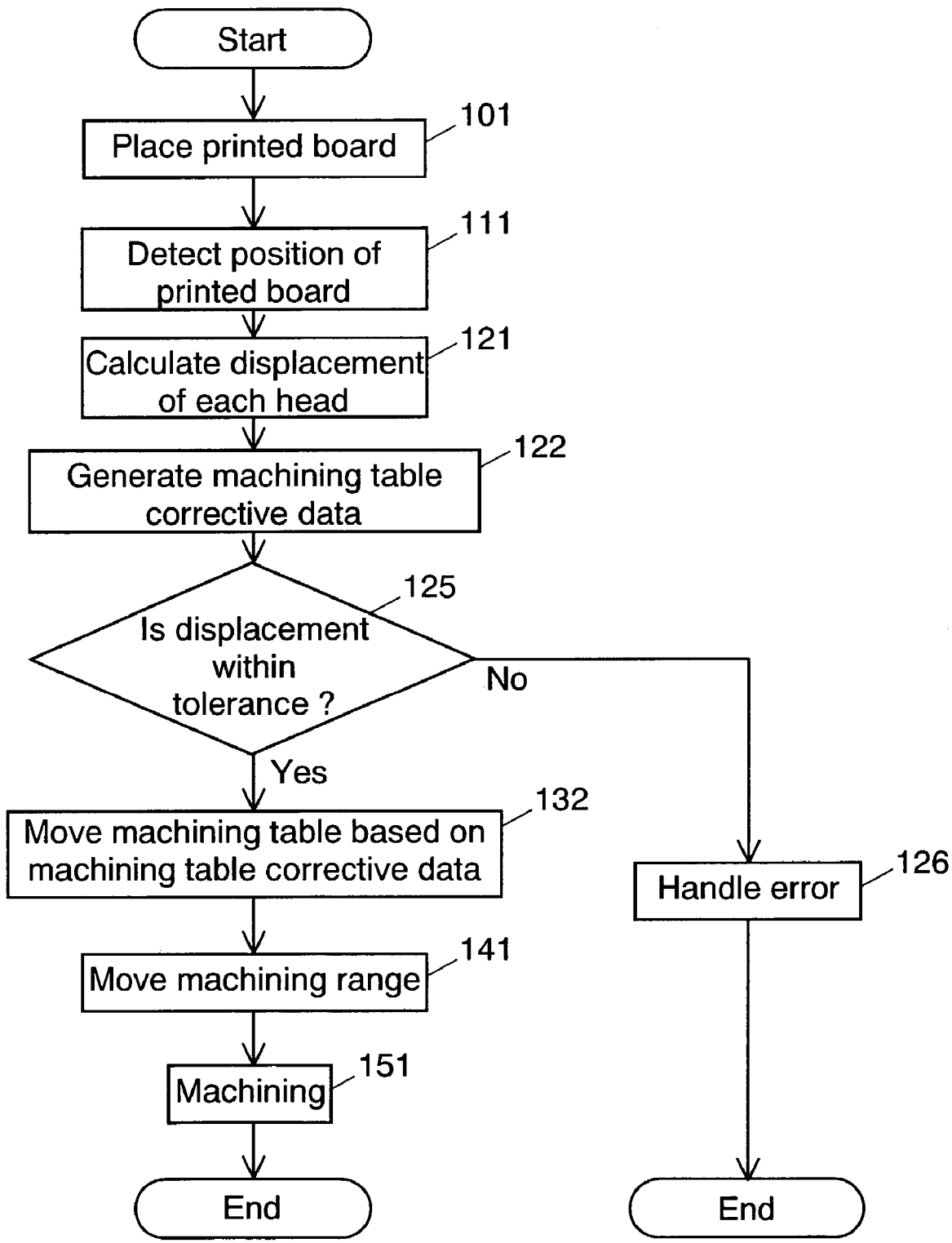
FIG. 8 is a flow chart of a machining method in accordance with exemplary embodiment 3 of the present invention.

Operations of the present embodiment are described hereinafter with reference to FIG. 3 and FIG. 8.

In step 101 to step 121, operations are the same as those in embodiment 1, and displacement between a position of each machining head and a position of each printed board is calculated. Next, in generating step 122 of machining table corrective data, the following operation is performed.

Machining table correcting unit 44 calculates a moving amount of the machining table so as to nearly equalize the displacements between respective machining heads and work pieces that are received from recognizing unit 9. This calculation is performed using an average of the displacements. Machining table correcting unit 44 outputs the calculated moving amount as machining table corrective data to main controller 2.

Then, similarly to embodiment 2, it is checked in step 125 whether or not moving amounts of the machining heads in machining ranges exceed the maximum machining ranges. When the moving amounts are within the maximum machining ranges, this operation proceeds to step 132. When the moving amounts are out of the maximum machining ranges, error handling is performed in step 126 and the machining is finished. In step 132, the following operation is performed.

Main positioning controller 41 adds the machining table corrective data to desired positional data, and outputs the result to machining table controller 6. Machining table controller 6 controls Y-axis driving unit 61 and X-axis driving unit 62 to move machining table 7 to a position where the calculated displacements are nearly equal.

Operations after this are the same as those in embodiment 1. Such structure and machining method allow easy correction of the displacements.

Figure 13:
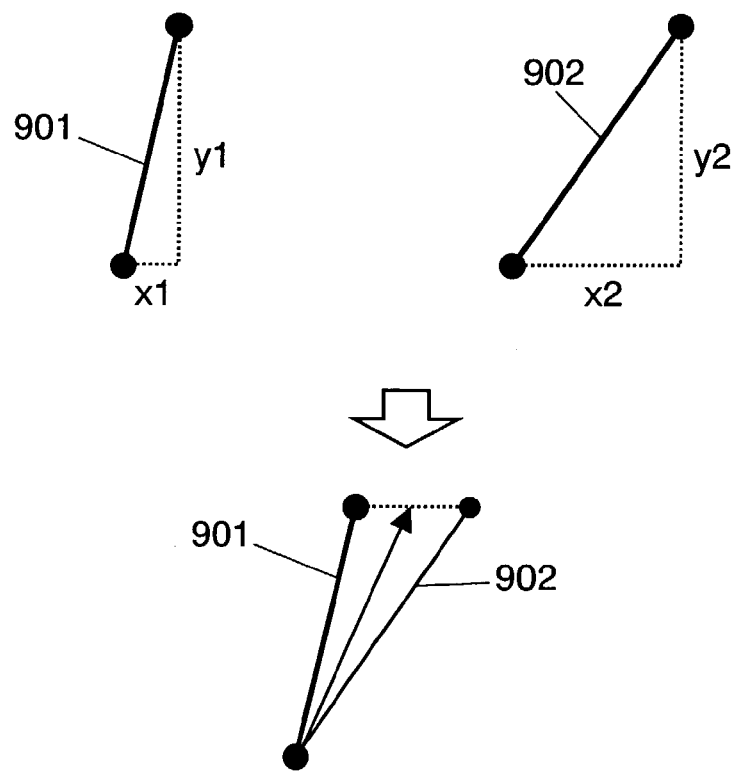
FIG. 13 is an explanatory drawing of a process of correcting displacements of the machining heads with a machining table.

A method of calculating the machining table corrective data is described with reference to FIG. 13. Assuming that displacement 901 on head 81 side is (x1, y1) and displacement 902 on head 82 side is (x2, y2), an average 903 of them is (x1/2 +x2/2, y1/2+y2/2). When the machining table is moved by the average, displacements of both heads become smallest. The machining table correcting unit 44 operates using the moving amount as the machining table corrective data.

(Exemplary Embodiment 4)

Figure 4:
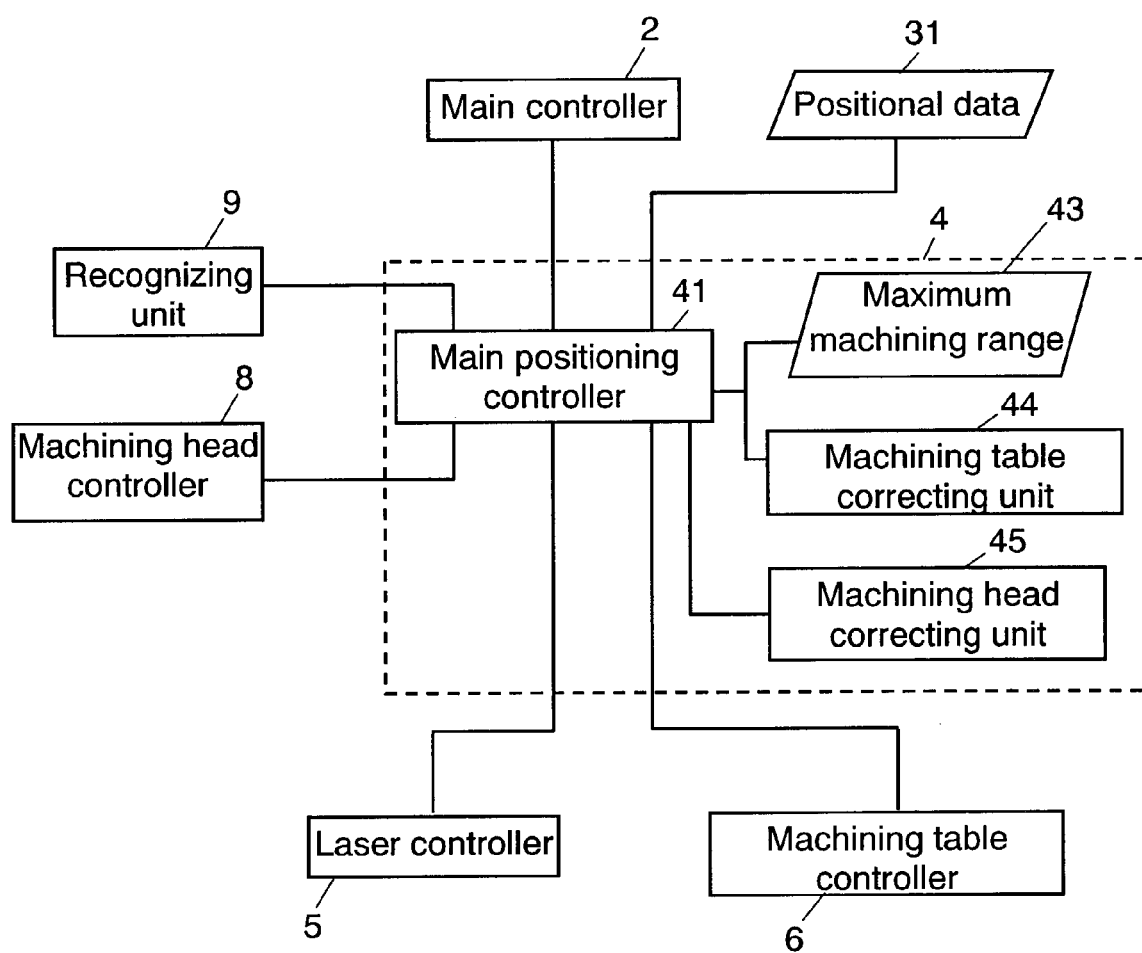
FIG. 4 is a block diagram of a positioning controller of a machining device in accordance with exemplary embodiment 4 and exemplary embodiment 6 of the present invention.

FIG. 4 is a detailed block diagram of a positioning controller 4 of a machining device in accordance with exemplary embodiment 4 of the present invention. Positioning controller 4 has machining head correcting unit 45 in addition to the elements in exemplary embodiment 3. Machining head correcting unit 45 calculates machining head corrective data so as to substantially eliminate displacement of each machining head, and outputs the data to main positioning controller 41.

Figure 9:
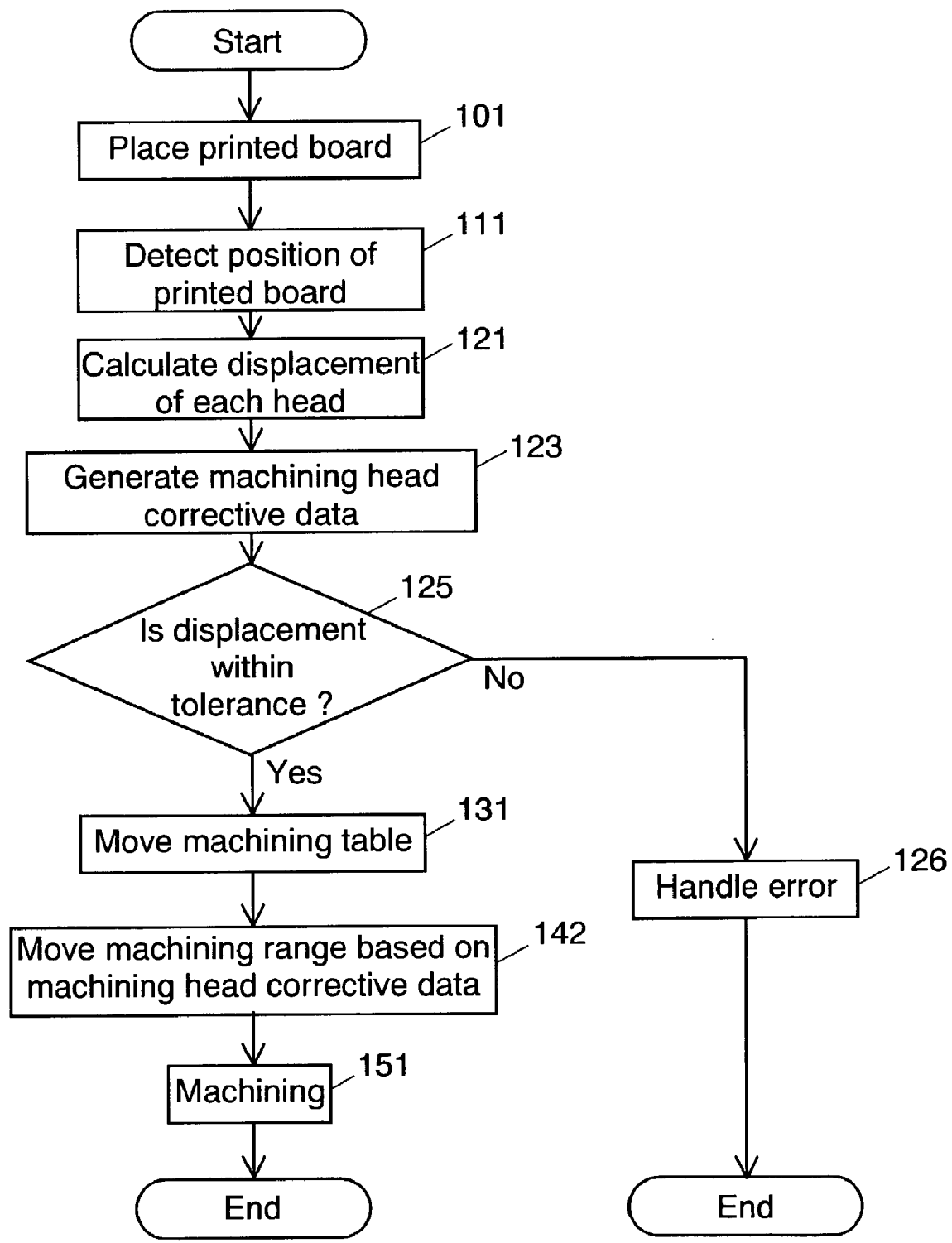
FIG. 9 is a flow chart of a machining method in accordance with exemplary embodiment 4 of the present invention.

Operations of the present embodiment are described with reference to FIG. 4 and FIG. 9.

In step 101 to step 121, operations are the same as those in embodiment 1, and the displacement between a position of each machining head and a position of each printed board is calculated. Next, in generating step 123 of machining head corrective data, the following operation is performed.

Machining head corrective data for correcting the remaining displacements of machining heads 81, 82 after the movement in moving step 131 of the machining table is generated.

Then, similarly to embodiment 2, it is checked in step 125 whether or not moving amounts of the machining heads in machining ranges exceed the maximum machining ranges. When the moving amounts are within the maximum machining ranges, this operation proceeds to step 131. When the moving amounts are out of the maximum machining ranges, error handling is performed in step 126 and the machining is finished. In step 131 and step 132, the following operations are performed.

Machining table 7 is moved to a position where calculated displacements are nearly equal.

Then, main positioning controller 41 receives calculated machining head corrective data, supplies a moving command to machining head controller 8 based on the data, and moves machining ranges of respective machining heads 81, 82 in step 142.

Displacements between machining head 81 and printed board 71 and between machining head 82 and printed board 72 are thus corrected. The machining is then performed. Such structure and machining method allow easy correction of the displacements.

Figure 14A:
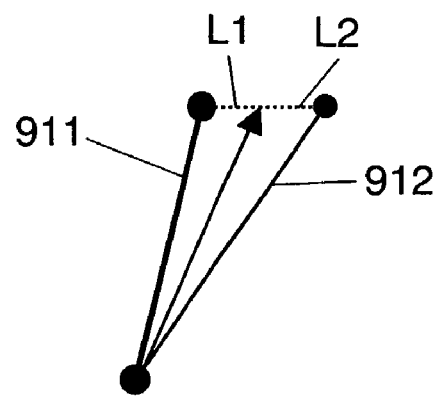
FIG. 14A is an explanatory drawing of a process of correcting displacements of the machining heads with the machining heads.
Figure 14B:
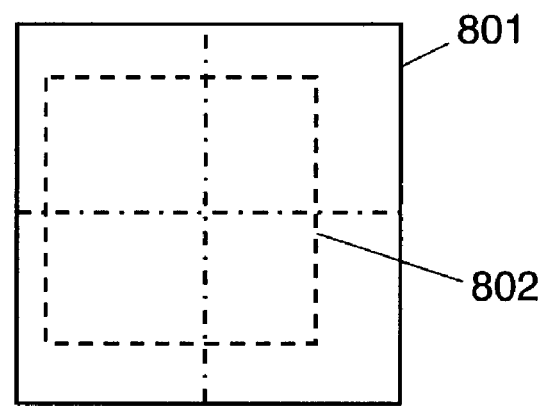
FIG. 14B is a pattern diagram of a machining range of one of the machining heads of FIG. 14A.
Figure 14C:
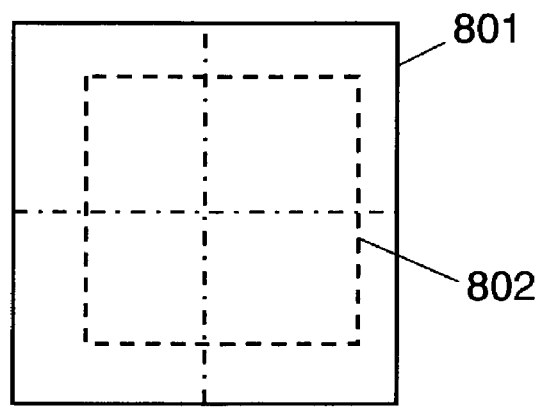
FIG. 14C is a pattern diagram of a machining range of the other of the machining heads of FIG. 14A.

A method of calculating the machining head corrective data is described with reference to FIG. 14A. The arrow disposed in an intermediate position between machining heads 81, 82 shows a vector moving on the machining table so as to nearly equalize displacement 911 of machining head 81 with displacement 912 of machining head 82. After the movement of the arrow on the machining table, the displacement on the machining head 81 side is L1 and the displacement on the machining head 82 side is L2. For substantially eliminating L1 and L2, each machining head moves each machining range. In this case, machining head corrective data for respective machining heads is L1 and L2. Positions of respective machining ranges of machining heads 81, 82 are images shown in FIG. 14B and FIG. 14G.

(Exemplary Embodiment 5)

Figure 5:
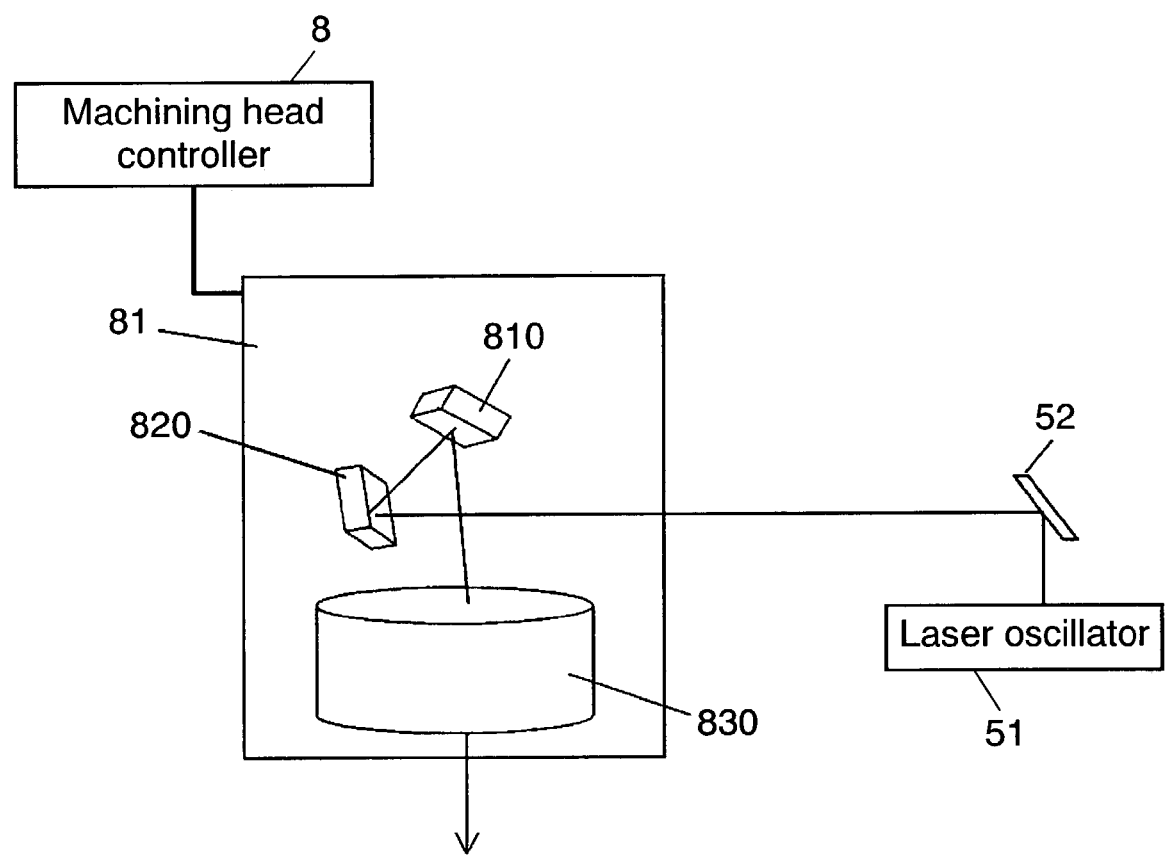
FIG. 5 is a detailed block diagram of machining heads of a machining device in accordance with exemplary embodiment 5 of the present invention.

FIG. 5 is a detailed block diagram of machining heads of a machining device in accordance with exemplary embodiment 5 of the present invention.

Laser beams emitted from laser oscillator 51 are guided to machining head 81 by mirror 52, two-dimensionally positioned by galvano scanners 810, 820, and focused on a work piece by lens 830. Thus, the work piece is machined. Galvano scanners 810, 820 realize two-dimensional positioning of the laser beams, and machining head controller 8 controls galvano scanners 810, 820.

On receiving a command from machining head controller 8, galvano scanners 810, 820 move the machining ranges. Machining head 81 has been described here; however, machining head 82 is also similar to machining head 81.

(Exemplary Embodiment 6)

Figure 10:
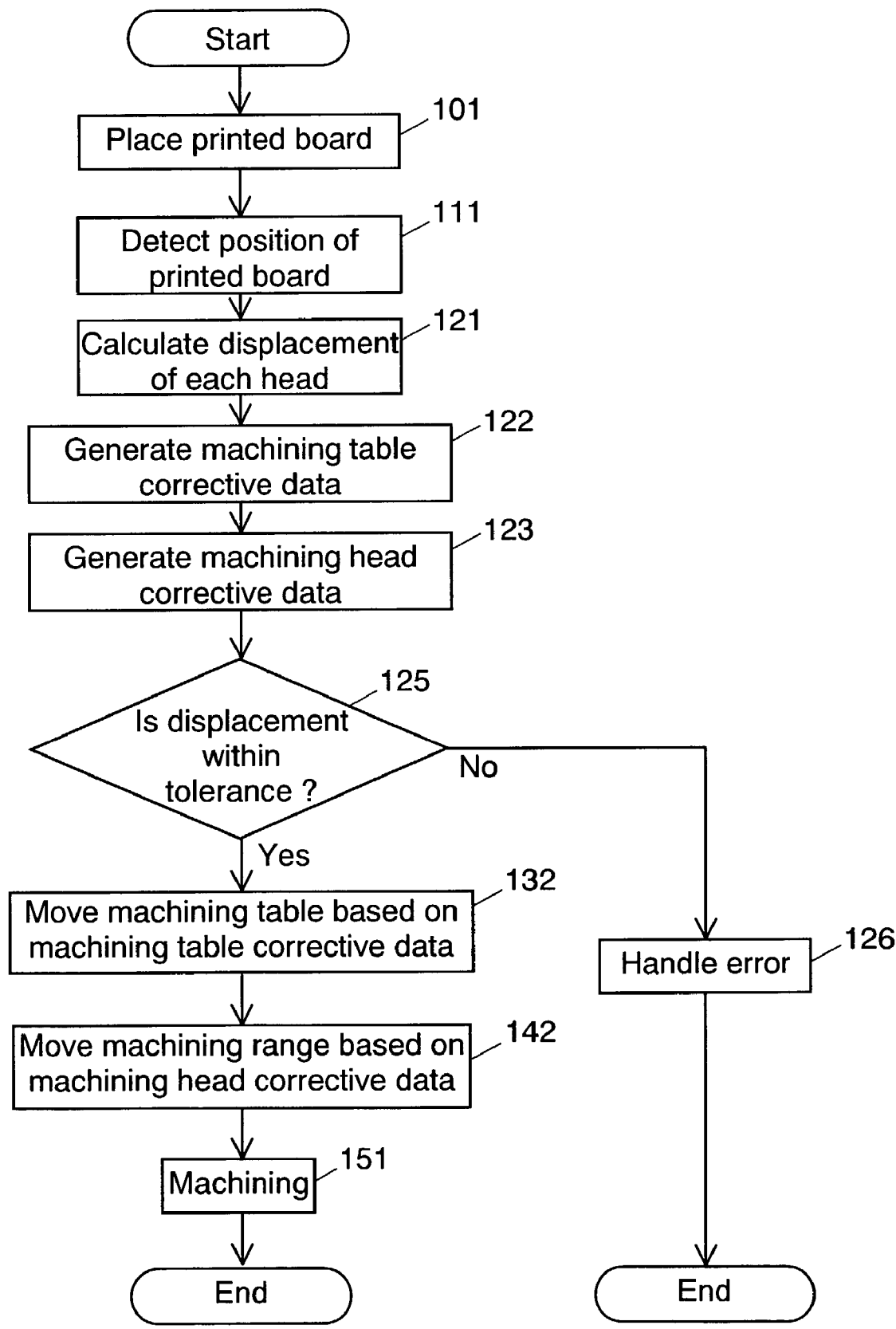
FIG. 10 is a flow chart of a machining method in accordance with exemplary embodiment 6 of the present invention.
Figure 11:
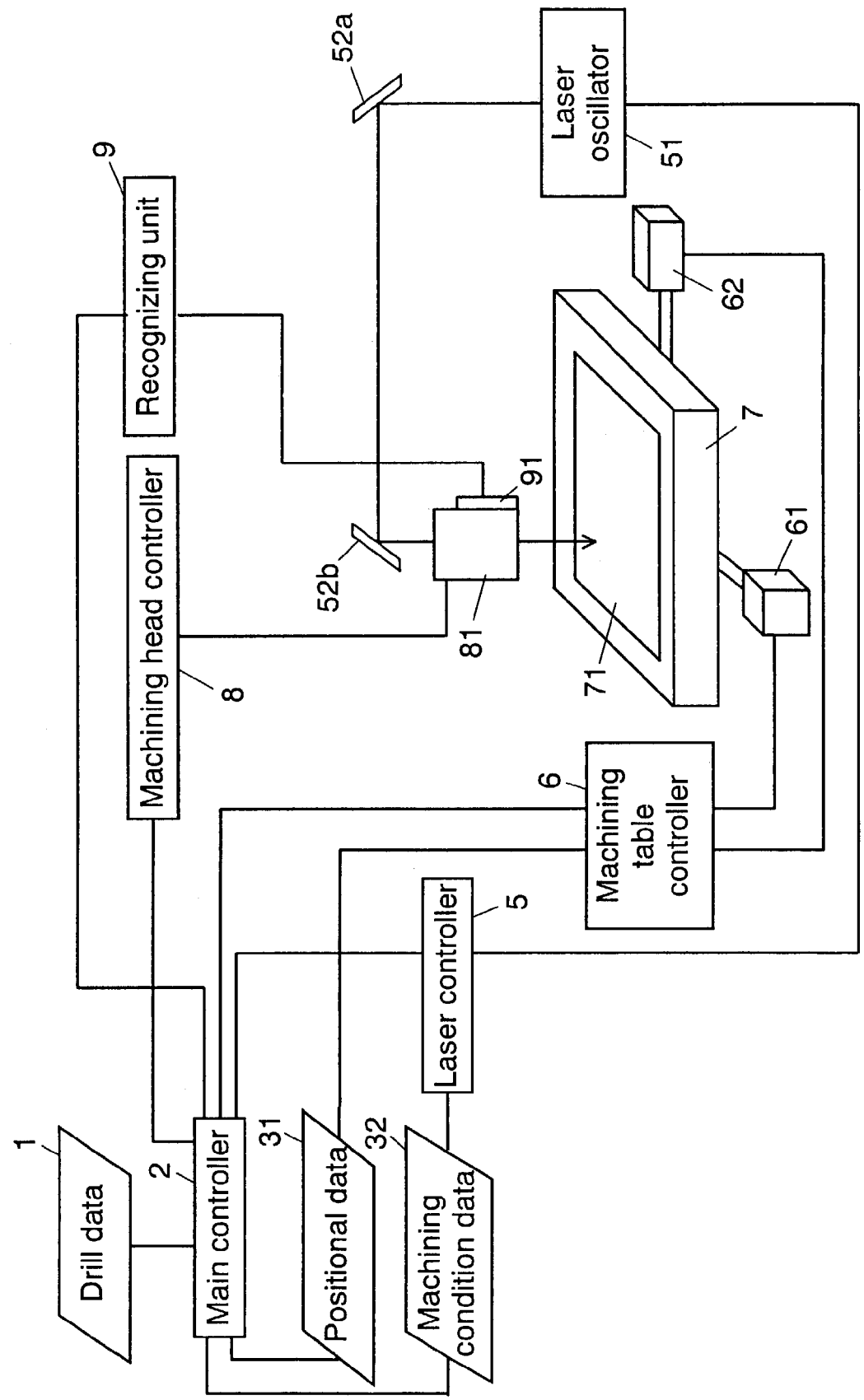
FIG. 11 is a block diagram of a conventional machining device.

Exemplary embodiment 6 of the present invention is a machining method using the machining device of exemplary embodiment 4. The machining method is described hereinafter with reference to FIG. 1, FIG. 4, and FIG. 10.

In step 101 to step 122, operations are the same as those in embodiment 4, displacements between respective machining heads and printed boards are calculated, an average of displacements of the heads from the calculated displacements is calculated, and machining table corrective data is generated. Next, in generating step 123 of machining head corrective data, machining head corrective data for correcting the remaining displacements of machining heads 81. 82 after the movement in moving step 132 of the machining table is generated. In step 125, similarly to embodiment 4, moving amounts of machining ranges of machining heads 81, 82 are determined. In step 132, the machining table corrective data generated in step 122 is added to a desired positional data, and machining table 7 is moved to a position after the correction. In step 142, the machining ranges of machining heads 81, 82 are shifted by the generated machining head corrective data, and displacements between machining head 81 and printed board 71 and between machining head 82 and printed board 72 are thus corrected. After the steps discussed above are performed, laser beams are radiated to perform machining step 152.

Since corrective data is previously generated in step 122 and step 123, the correcting processes in step 132 and step 142 can be simplified and the corrections can be facilitated. Since each printed board is positioned and then machined, accuracy of the machining position is improved.

In the embodiments of the present invention, storage units 1, 31, 32, and 43 are formed of a general semiconductor memory, a magnetic memory such as a hard disk or a floppy disk, or a magnet-optical memory such as a magnet-optical disk. The units have been described to be individual, but some of them may be integrally formed.

Any of main controller 2, positioning controller 4 (main positioning controller 41, machining table correcting unit 44, and machining head correcting unit 45), laser controller 5, machining table controller 6, and machining head controller 8 is formed of a microcomputer. They have been described to be individual, but some of them may be integrally formed.

INDUSTRIAL APPLICABILITY

A machining device of the present invention detects positions of work pieces with detectors disposed in machining heads, calculates displacements between the positions of respective work pieces and positions of respective machining heads, moves a machining table so as to nearly equalize the displacements of the machining heads, and moves machining ranges of the machining heads. Thus, when at least two work pieces are simultaneously machined by one machining device, displacements between respective work pieces and machining heads can be easily substantially eliminated, laser beams can be radiated to a correct position, and machining can be performed with high accuracy in machining position.

REFERENCE NUMERALS

1 Storage unit
2 Main controller
31, 32 Storage units
4 Positioning controller
41 Main positioning controller
43 Storage unit
44 Machining table correcting unit
45 Machining head correcting unit
5 Laser controller
51 Laser oscillator
52a, 52b Mirrors
53 Spectroscope
6 Machining table controller
61 Y-axis driving unit
62 X-axis driving unit
7 Machining table
71, 72 Printed boards
8 Machining head controller
81, 82 Machining heads
810, 820 Galvano scanners
830 lens
9 Recognizing unit
91, 92 Cameras
101 Placing step of printed board
111 Detecting step of position of printed board
121 Calculating step of displacement every head
122 Generating step of machining table corrective data
123 Generating step of machining head corrective data
125 Step of determining whether or not displacement of each head is within tolerance
126 Error handling step
131 Moving step of machining table
132 Moving step of machining table based on machining table corrective data
141 Moving step of machining range
142 Moving step of machining range of machining head based on machining head corrective data
151 Machining step

What is claimed is:

1. A machining device comprising:
   a machining table for receiving at least two work pieces;
   at least two machining heads for machining the work pieces, said machining heads being substantially fixed to positions facing said machining table; and
   detectors for detecting positions of the work pieces, said detectors being disposed in said machining heads,
   a positioning controller for determining how said machining table is to be moved so as to equalize displacements of said machining heads based on a detection result of said detectors,
   a machining head controller for moving machining ranges of said machining heads so as to eliminate the displacements of said machining heads.

2. A machining device according to claim 1 further comprising:
   a driving unit for moving said machining table;
   a machining table controller for controlling said driving unit; and
   a machining head controller for moving the machining ranges of said machining heads;
      wherein said positioning controller is for receiving a signal from said detectors and receiving displacements between the work pieces and said machining heads for machining the work pieces,
      said positioning controller outputs, to said machining table controller, a signal for moving said machining table so as to equalize the displacements of said respective machining heads using said machining heads, and
      said positioning controller outputs, to said machining head controller, a signal for moving the machining ranges of said machining heads so as to eliminate the displacements of said respective machining heads.

3. A machining device according to claim 1,
   wherein, in moving the machining ranges of said machining heads so as to eliminate the displacements of said respective machining heads, said machining device stops machining when each of the machining ranges is out of maximum machining range.

4. A machining device according to claim 2,
   wherein, in moving the machining ranges of said machining heads so as to eliminate the displacements of said respective machining heads, said positioning controller outputs a signal for stopping machining when each of the machining ranges is out of maximum machining range.

5. A machining device according to claim 2,
   wherein said positioning controller processes machining table corrective data, namely moving data in moving said machining table so as to equalize the displacements of said respective machining heads.

6. A machining device according to claim 5, further comprising a storage unit for storing machining positional data indicating machining positions of the work pieces,
wherein said positioning controller processes the machining positional data and the machining table corrective data.

7. A machining device according to claim 2,
wherein said positioning controller processes machining head corrective data, namely moving data in moving the machining ranges of said machining heads so as to eliminate the displacements of said respective machining heads.

8. A machining device according to claim 7, further comprising a storage unit for storing machining positional data indicating machining positions of the work pieces,
wherein said positioning controller processes the machining positional data and the machining head corrective data.

9. A machining device according to claim 1, further comprising:
a laser oscillator for supplying laser beams to said machining heads; and
a galvano scanner and a lens for radiating, to the work pieces, the laser beams supplied to said machining heads.

10. A machining method comprising the steps of:
placing at least two work pieces on a machining table;
recognizing positions of the placed work pieces;
calculating displacements between the work pieces and machining heads for machining the work pieces respectively;
moving the machining table to a position for equalizing the displacements of the respective machining heads; and
moving a machining range of each machining head at a position of the moved machining table.

11. A machining method according to claim 10,
wherein, in moving the machining ranges of the machining heads so as to eliminate the displacements between the work pieces and machining heads for machining the work pieces at the position of the moved machining table, machining is stopped when each of the machining ranges of the respective machining heads is out of maximum machining range.

12. A machining method according to claim 10,
wherein the step of moving the machining table comprises the steps of:
generating machining table corrective data for moving the machining table to a position for equalizing the displacements of the respective machining heads; and
moving the machining table based on the machining table corrective data.

13. A machining method according to claim 10,
wherein the step of moving the machining range of each machining head comprises the steps of:
generating machining head corrective data for moving the machining heads to positions for equalizing the displacements of the respective machining heads; and
moving each of the machining ranges of the machining heads based on the machining head corrective data at the position of the moved machining table.

14. A machining method according to claim 10,
wherein laser beams are radiated to the work pieces via the machining heads.

* * * * *